(12) United States Patent
Lee (10) Patent No.: US 8,575,607 B2
(45) Date of Patent: Nov. 5, 2013

(54) FLAT PANEL DISPLAY DEVICE AND METHOD OF MANUFACTURING THE SAME

(75) Inventor: June-Woo Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 1096 days.

(21) Appl. No.: 12/546,965

(22) Filed: Aug. 25, 2009

(65) Prior Publication Data

US 2010/0052534 A1    Mar. 4, 2010

(30) Foreign Application Priority Data

Aug. 27, 2008  (KR) .................. 10-2008-0084037

(51) Int. Cl.
*H01L 29/04* (2006.01)

(52) U.S. Cl.
USPC ............................................. 257/57; 438/149

(58) Field of Classification Search
CPC ................................ H01L 29/04; H01L 21/00
USPC ........ 257/52, 57, 63, 66, 72; 438/149; 445/24
See application file for complete search history.

(56) References Cited

U.S. PATENT DOCUMENTS

| 7,145,623 B2 * | 12/2006 | Sasaki ............................ 349/144 |
| 7,588,976 B2 * | 9/2009 | Makimura et al. ............ 438/166 |
| 2006/0038752 A1 * | 2/2006 | Winters ........................... 345/76 |
| 2006/0151789 A1 * | 7/2006 | Murakami et al. .............. 257/72 |
| 2006/0273314 A1 * | 12/2006 | Lee .................................. 257/59 |
| 2008/0299713 A1 * | 12/2008 | Kim .............................. 438/166 |

FOREIGN PATENT DOCUMENTS

| JP | 2000-155538 | 6/2000 |
| JP | 2000-216088 | 8/2000 |
| JP | 2000-315652 | 11/2000 |
| JP | 2004-213027 | 7/2004 |
| KR | 10-2005-0068537 | 7/2005 |
| KR | 10-2007-0012895 | 1/2007 |
| KR | 10-0667091 B1 | 1/2007 |
| KR | 10-0708714 | 4/2007 |

OTHER PUBLICATIONS

Korean Registration Determination Certificate issued May 31, 2010, in corresponding Korean Patent Application No. 10-2008-0084037.
Abstract of Korean Publication No. 10-2007-0036994.

* cited by examiner

*Primary Examiner* — Thuy Vinh Tran
(74) *Attorney, Agent, or Firm* — Christie, Parker & Hale, LLP (57) ABSTRACT

A flat panel display device that can achieve uniformity between pixel circuits and improved image quality includes: a first pixel including a first light emitting device and not including a pixel circuit; and a second pixel spaced apart from the first pixel and including a first circuit that is electrically connected to the first light emitting device. Active layers of thin film transistors in the pixel circuits are formed of polycrystalline silicon crystallized from an amorphous silicon and patterned from an area of the polycrystalline silicon in which lasers of an excimer laser annealing process did not overlap.

12 Claims, 6 Drawing Sheets

FLAT PANEL DISPLAY DEVICE AND METHOD OF MANUFACTURING THE SAME

CROSS-REFERENCE TO RELATED APPLICATIONS

This application claims the benefit of Korean Patent Application No. 10-2008-0084037, filed on Aug. 27, 2008, in the Korean Intellectual Property Office, the disclosure of which is incorporated herein by reference.

BACKGROUND OF THE INVENTION

1. Field of the Invention

Aspects of the present invention relate to a flat panel display device and a method of manufacturing the same, and more particularly, to a flat panel display device with uniform light emission characteristics and a method of manufacturing the flat panel display device.

2. Description of the Related Art

Since the brightness of flat panel display devices, e.g., organic light emitting display devices, is determined by the amount of current flowing through the flat panel display devices, the flat panel display devices are driven by converting an input voltage signal into an output current. In this regard, the electron mobility of a thin film transistor of a pixel circuit is very important.

Monocrystalline silicon wafers may be the best choice considering only the electron mobility and uniformity of thin film transistors. However, since such monocrystalline silicon wafers are expensive, thin film transistors for flat panel display devices are formed of polycrystalline silicon that is prepared by depositing and crystallizing amorphous silicon on a glass substrate.

However, since such a glass substrate is fragile and deforms at a temperature higher than 400° C., a method of forming a polycrystalline silicon thin film in which a glass substrate rarely deforms during crystallization is desired.

For example, a polycrystalline silicon thin film may be selectively formed to a thickness of approximately 500 Å by excimer laser annealing (ELA). It is known that ELA ensures the highest degree of crystallization and uniformity among existing low temperature annealing processes, and particularly when being applied to an active matrix organic light emitting display device, ELA produces a flat panel display device having the highest image quality among the existing low temperature annealing processes.

However, ELA is expensive when applied to large panels with a size of 30 inches or more, and ELA has a maximum excimer laser width of approximately 470 mm. That is, a panel cannot be entirely scanned for crystallization by ELA at one time because the excimer laser width is narrow, and thus the panel is scanned several times, thereby producing overlapped areas in which excimer laser beams overlap.

The overlapped areas in which the excimer laser beams overlap produce crystallized polycrystalline silicon having less uniform characteristics than other areas in which the excimer laser beams do not overlap. If a pixel circuit is formed in the overlapped areas, image quality is degraded. For example, the brightness of a corresponding pixel is reduced or lines may appear on a screen.

SUMMARY OF THE INVENTION

Aspects of the present invention provide a flat panel display device that can achieve uniformity between pixel circuits and improve image quality.

According to an aspect of the present invention, there is provided a flat panel display device including: a first pixel including a first light emitting device and not including a pixel circuit; and a second pixel spaced apart from the first pixel and including a first circuit that is electrically connected to the first light emitting device.

According to an aspect of the present invention, the second pixel may comprise a second light emitting device.

According to an aspect of the present invention, the flat panel display device may further comprise a third pixel spaced apart from the first pixel.

According to an aspect of the present invention, the third pixel may comprise a second pixel circuit that is electrically connected to the second light emitting device.

According to another aspect of the present invention, there is provided a flat panel display device including: a first area including a plurality of first pixels, each of which comprises a first light emitting device and does not comprise a pixel circuit; a second area including a plurality of second pixels, each of which comprises a first pixel circuit that is electrically connected to the first light emitting device of one of the first pixels; and a plurality of first wires, which connect respectively the first light emitting devices of the first area to the first pixel circuits of the second area.

According to an aspect of the present invention, each of the plurality of second pixels of the second area may comprise a second light emitting device and a second pixel circuit that is electrically connected to the second light emitting device.

According to an aspect of the present invention, the flat panel display device may further comprise a plurality of second wires, which connect respectively the second light emitting devices of the second area to the second pixel circuits of the second area.

According to an aspect of the present invention, the second light emitting device of each of the plurality of second pixels may be electrically connected to a second pixel circuit of another adjacent second pixel.

According to an aspect of the present invention, the flat panel display device may further comprise: a first insulating layer covering the first pixel circuit and/or the second pixel circuit; and a second insulating layer covering the first insulating layer, wherein the first wire and/or the second wire is disposed between the first insulating layer and the second insulating layer, and the first light emitting device and/or the second light emitting device is disposed on the second insulating layer.

According to another aspect of the present invention, there is provided a method of manufacturing a flat panel display device, the method including: forming an amorphous silicon layer on a substrate; forming a polycrystalline silicon layer from the amorphous silicon layer by directing thereon laser beams such that the laser beams overlap each other in overlapped areas; patterning the polycrystalline silicon layer to form a plurality of active layers for pixel circuits in non-overlapped areas of the polycrystalline silicon layer, the non-overlapped areas being areas of the polycrystalline silicon layer in which the laser beams did not overlap; and forming a plurality of light emitting devices in the overlapped areas, the light emitting devices being electrically connected to the pixel circuits.

According to an aspect of the present invention, the method may further comprise: forming a first insulating layer to cover the pixel circuits; forming a plurality of wires, which are electrically connected to the pixel circuits, on the first insulating layer; and forming a second insulating layer on the first insulating layer to cover the plurality of wires, wherein the light emitting devices are disposed on the second insulating layer and electrically connected to the plurality of wires via contact holes in the second insulating layer.

According to an aspect of the present invention, the light emitting devices may also be formed on the non-overlapped areas in which the laser beams do not overlap.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures. It will be understood that when an element, such as a layer, film, region, or substrate is referred to as being formed or disposed on another element, it can be directly on the other element, or intervening elements may also be present. In contrast, when an element is referred to as being formed or disposed directly on another element, there are no intervening elements present.

Figure 1:
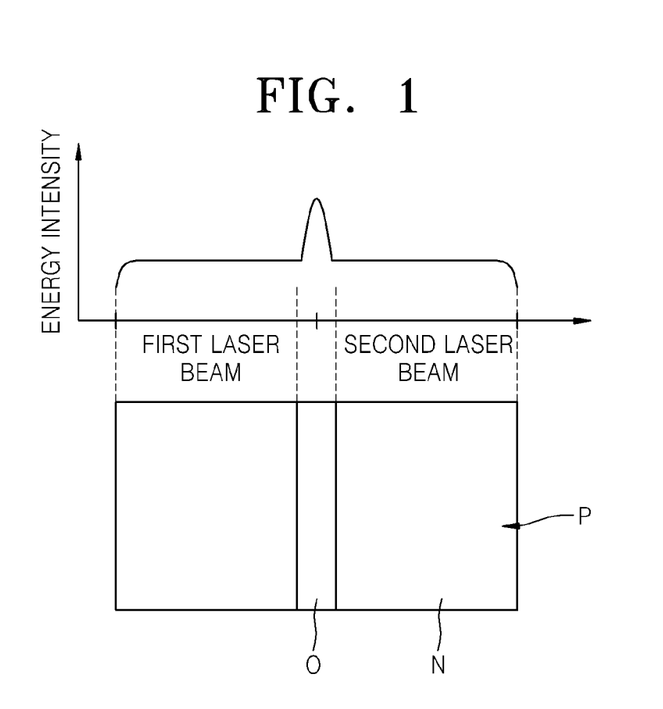
FIG. 1 illustrates a relationship between a beam width of laser beams and an energy intensity of crystallization when an amorphous silicon layer is crystallized into a polycrystalline silicon layer by excimer laser annealing (ELA) and the state of the polycrystalline silicon layer formed in a flat panel display device according to an embodiment of the present invention.

FIG. 1 illustrates a relationship between a beam width of laser beams and an energy intensity of crystallization when an amorphous silicon layer is crystallized into a polycrystalline silicon layer P by excimer laser annealing (ELA) and the state of the polycrystalline silicon layer formed in a flat panel display device according to an embodiment of the present invention. Referring to FIG. 1, first and second laser beams used by ELA inevitably overlap each other because of their narrow beam width. Accordingly, the polycrystalline silicon layer P formed by ELA has an overlapped area O in which the laser beams overlap and a non-overlapped area N in which the laser beams do not overlap. The energy intensity is greatest where the first and second laser beams overlap in the overlapped area O; thus, a thin film transistor formed in the overlapped area O and a thin film transistor formed in the non-overlapped area N have different characteristics. Accordingly, if pixels are formed in the same configuration in the overlapped area O and the non-overlapped area N, uniform image quality cannot be achieved.

Figure 2:
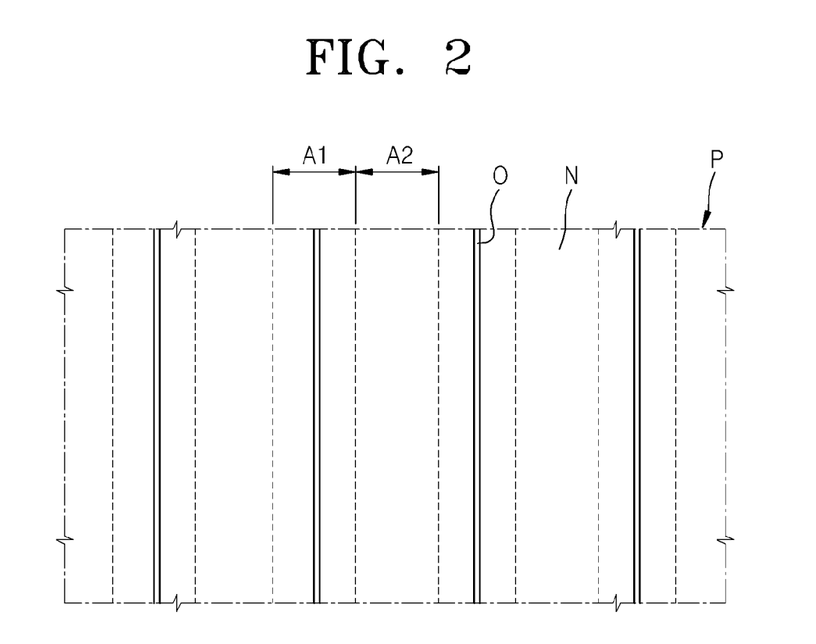
FIG. 2 is a plan view illustrating a first area and a second area formed on the polycrystalline silicon layer of FIG. 1.

FIG. 2 is a plan view illustrating a first area A1 and a second area A2 formed on the polycrystalline silicon layer P of FIG. 1. Referring to FIG. 2, pixels are formed in different configurations in the first area A1 defined to include an overlapped area O and the second area A2 defined to include a non-overlapped area N.

Figure 3:
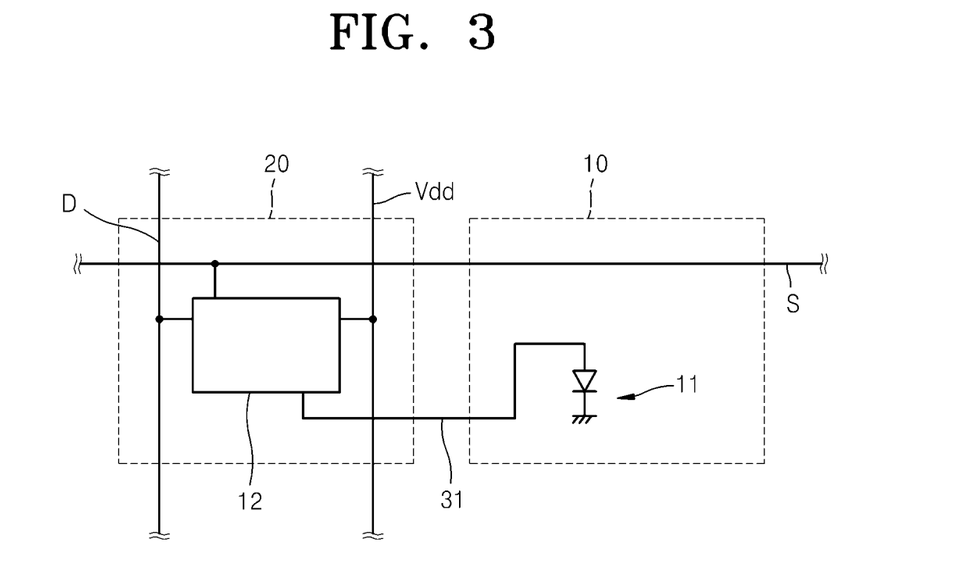
FIG. 3 is a circuit diagram illustrating a first pixel and a second pixel respectively formed in the first area and the second area of FIG. 2.

FIG. 3 is a circuit diagram illustrating a first pixel 10 formed in the first area A1 of FIG. 2 and a second pixel 20 formed in the second area A2 of FIG. 2. Referring to FIG. 3, the first pixel 10 includes a first light emitting device 11, and the second pixel 20 includes a first pixel circuit 12. The first pixel 10 does not include any pixel circuit. Although the second pixel 20 in FIG. 3 does not include a light emitting device, the present invention is not limited thereto and the second pixel 20 may include a light emitting device.

A driving power line Vdd, a data line D, and a scan line S pass through the second pixel 20, and the scan line S passes through the first pixel 10. Although not shown, the driving power line Vdd and the data line D may also pass through the first pixel 10.

Figure 4:
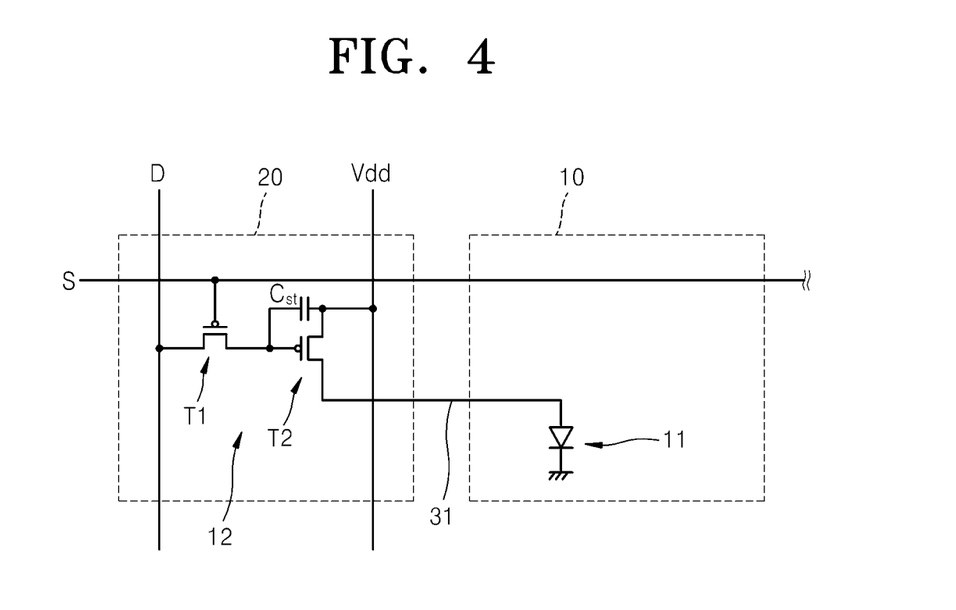
FIG. 4 is a detailed circuit diagram of FIG. 3.

FIG. 4 is a detailed circuit diagram illustrating the first pixel circuit 12 of FIG. 3. The first pixel circuit 12 includes two thin film transistors T1 and T2 and one storage capacitor $C_{st}$. The first thin film transistor T1 is a switch transistor, and the first thin film transistor T1 has a gate electrode connected to the scan line S, a source electrode connected to the data line D, and a drain electrode connected to the storage capacitor $C_{st}$ and a gate electrode of the second thin film transistor T2. However, according to aspects of the present invention, the drain electrode may be connected to the data line D, and the source electrode may be connected to the storage capacitor $C_{st}$ and the gate electrode of the second thin film transistor T2.

The storage capacitor $C_{st}$ has one electrode connected to the first thin film transistor T1 and an other electrode connected to the driving power line Vdd and the second thin film transistor T2.

The second thin film transistor T2 is a driving transistor for driving the first light emitting device 11, and the second thin film transistor T2 has the gate electrode connected to the first thin film transistor T1 and the storage capacitor $C_{st}$, and a source electrode connected to the storage capacitor $C_{st}$ and the driving power line Vdd. The second thin film transistor T2 has a drain electrode electrically connected to the first light emitting device 11 of the first pixel 10 and controls the operation of the first light emitting device 11. The second thin film transistor T2 and the first light emitting device 11 are electrically connected to each other by a first wire 31. However, according to aspects of the present invention, the second thin film transistor T2 may have the drain electrode connected to the storage capacitor $C_{st}$ and the driving power line Vdd, and the source electrode electrically connected to the first light emitting device 11 of the first pixel 10 via the first wire 31.

Although the first and second thin film transistors T1 and T2 are P-type thin film transistors in FIG. 4, aspects of the present invention are not limited thereto, and the first and second thin film transistors T1 and T2 may be N-type thin film transistors, or a combination of N-type and P-type thin film transistors.

Since the flat panel display device of FIG. 1 does not include a pixel circuit in the overlapped area O in which laser beams overlap each other to crystallize the amorphous silicon layer into the polycrystalline silicon layer, and only the light emitting device 11 is formed in the overlapped area O, and the light emitting device 11 is driven by using the first pixel circuit 12 formed in the non-overlapped area N in which the laser beams do not overlap, the characteristics of the first pixel circuit 12 can be prevented from deteriorating and uniform luminous efficiency can be obtained over the entire surface of a panel of the flat panel display device.

A method of manufacturing the flat panel display device of FIG. 1 will now be explained with reference to FIGS. 2 and 5 through 7. Referring to FIG. 2, the amorphous silicon layer is formed on the entire surface of the panel, and is crystallized by ELA to form the polycrystalline silicon layer P. Referring to FIG. 7, the polycrystalline silicon layer P is formed on a top surface of a substrate 120 and a buffer layer 121 formed of silicon oxide may be further formed on the substrate 120. Although shown in FIG. 7, the buffer layer 121 need not be included in all aspects.

As described above, the polycrystalline silicon layer P has the overlapped area O in which laser beams overlap each other and the non-overlapped area N in which the laser beams do not overlap, the first area A1 defined to include the overlapped area O, and the second area A2 defined to include the non-overlapped area N.

Figure 5:
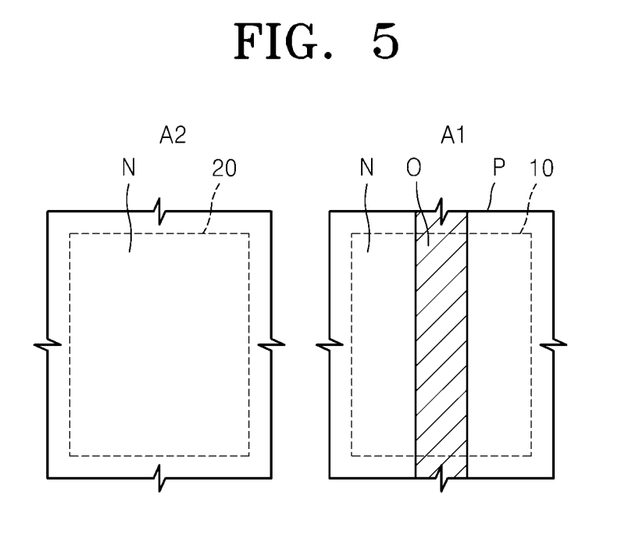
FIG. 5 is a plan view illustrating a polycrystalline silicon layer formed on the first pixel and the second pixel of FIG. 3.

Referring to FIG. 5, the first pixel 10 is formed in the first area A1 and the second pixel 20 is formed in the second area A2.

Figure 6:
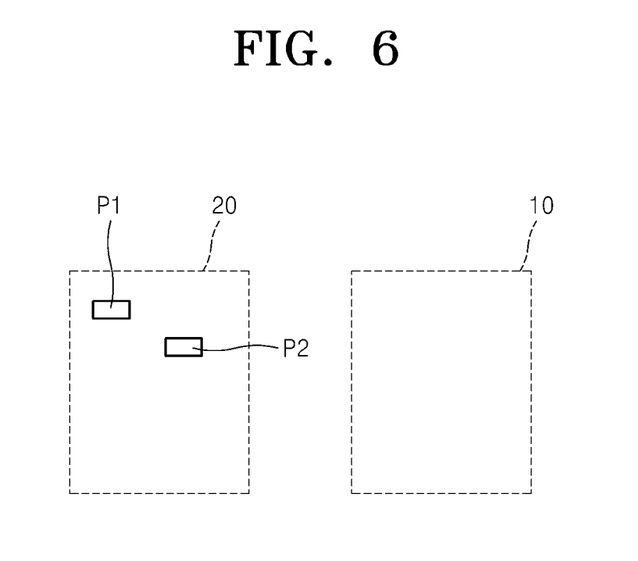
FIG. 6 is a plan view illustrating the polycrystalline silicon layer of FIG. 5 which is patterned.
Figure 7:
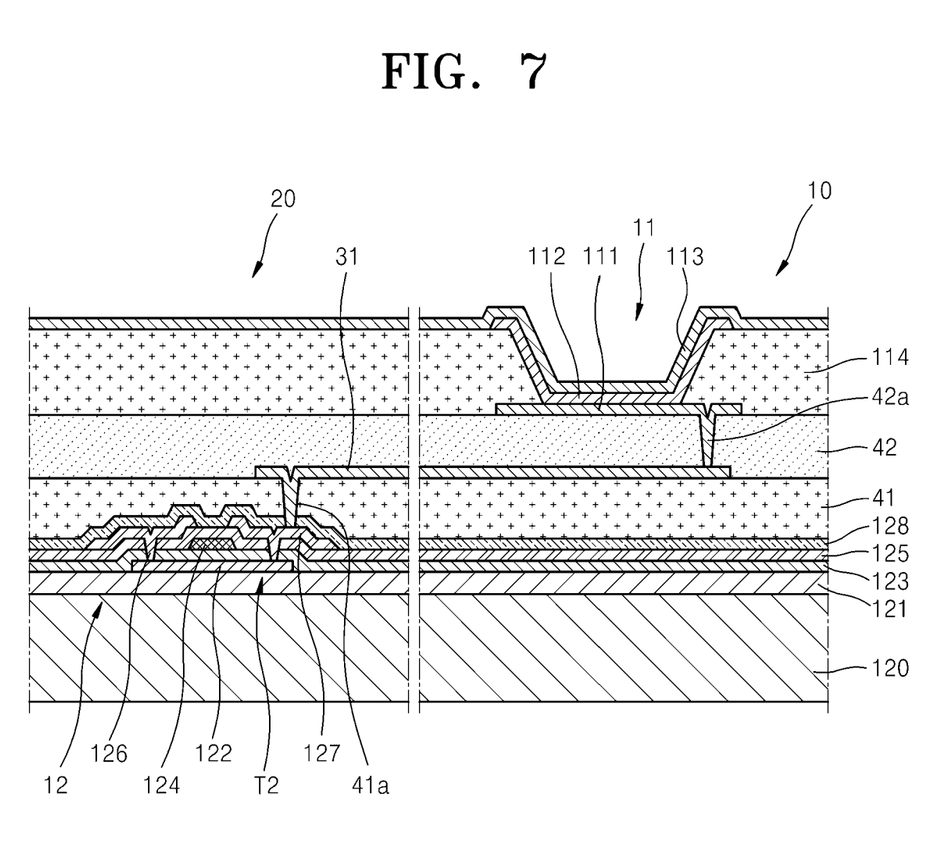
FIG. 7 is a cross-sectional view illustrating the first pixel and the second pixel of FIG. 4.

Referring to FIG. 6, parts of the polycrystalline silicon layer P corresponding to the first pixel 10 and the second pixel 20 are patterned to form polycrystalline silicon patterns P1 and P2 which are used to form active layers of the first and second thin film transistors T1 and T2. Of course, the polycrystalline silicon patterns P1 and P2 are disposed only in the second pixel 20, and part of the polycrystalline silicon layer P corresponding to the first pixel 10 is removed.

Next, the first and second thin film transistors T1 and T2 are formed by using the polycrystalline silicon patterns P1 and P2 as shown in FIG. 7. Although only the second thin film transistor T2 of the first pixel circuit 12 is shown in FIG. 7, the first thin film transistor T1 has the same structure as that of the second thin film transistor T2.

Referring to FIG. 7, an active layer 122 is formed by using the polycrystalline silicon pattern P2, a gate insulating layer 123 is formed to cover the active layer 122, and a gate electrode 124 is formed on the gate insulating layer 123. An interlayer insulating layer 125 is formed to cover the gate electrode 124, contact holes are formed in the interlayer insulating layer 125, and a source electrode 126 and a drain electrode 127 are formed on the interlayer insulating layer 125 to contact the active layer 122 through respective contact holes. A passivation layer 128 is formed to cover the second thin film transistor T2. Aspects of the present invention are not limited thereto and the second thin film transistor T2 may have other various structures.

After the second thin film transistor T2 is formed, a first insulating layer 41 is formed to cover the second thin film transistor T2. A contact hole 41a is formed in the first insulating layer 41, and the first wire 31 is formed on the first insulating layer 41. The first wire 31 contacts a drain electrode 127 of the second thin film transistor T2 through the contact hole 41a.

Next, a second insulating layer 42 is formed on the first insulating layer 41 to cover the first wire 31. A contact hole 42a is formed in the second insulating layer 42, and a first pixel electrode 111 is formed on the second insulating layer 42. The first pixel electrode 111 contacts the first wire 31 through the contact hole 42a. At least a top surface of the second insulating layer 42 may be planarized so that the first pixel electrode 111 formed on the top surface of the second insulating layer 42 does not have a stepped portion, i.e., is planar. The second insulating layer 42 may be an organic layer formed of a material that is easily planarized. The first wire 31 may be formed of Al, Mo, W, Ag, ITO, or IZO.

A pixel defining layer 114 is formed on the second insulating layer 42 to cover the first pixel electrode 111 and then is patterned to expose a portion of the first pixel electrode 111. A first organic layer 112 including an organic light emitting layer is formed on the exposed portion of the first pixel electrode 111, and a first common electrode 113 is formed on the first organic layer 112 and the pixel defining layer 114 to form the first light emitting device 11.

The first light emitting device 11 may be a top emission type organic light emitting device. Accordingly, the first pixel electrode 111 may be an electrode including a reflective layer, and the first common electrode 113 may have a high transmittance. However, the present invention is not limited thereto, and the first light emitting device 11 may be a bottom emission type organic light emitting device or a dual emission type organic light emitting device.

The first wire 31 is formed on the first insulating layer 41 covering the second thin film transistor T2 such that the first pixel circuit 12 formed in the second pixel 20 and the first light emitting device 11 formed in the first pixel 10 are electrically connected to each other by the first wire 31, thereby making it possible to form the first light emitting device 11 and the first pixel circuit 12, which are spaced apart from each other and are disposed in different pixels.

Figure 8:
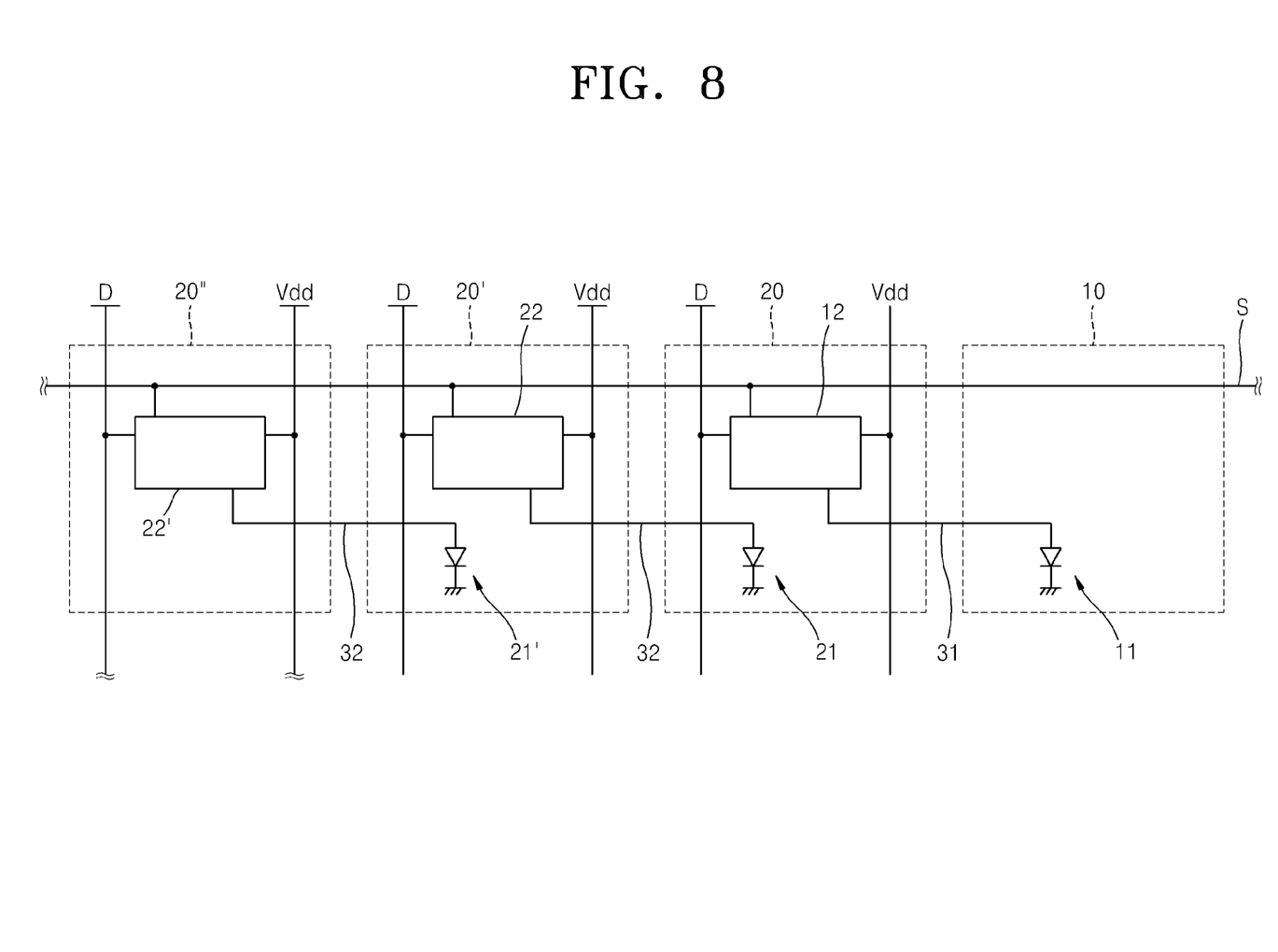
FIG. 8 is a circuit diagram illustrating first and second pixels in a flat panel display device according to another embodiment of the present invention.

FIG. 8 is a circuit diagram illustrating first and second pixels in a flat panel display device according to another embodiment of the present invention. Referring to FIG. 8, second pixels 20 and 20' include second light emitting devices 21 and 21', respectively. The second light emitting devices 21 and 21' are connected to second pixel circuits 22 and 22', respectively.

In FIG. 8, the second light emitting devices 21 and 21' are electrically connected to the second pixel circuits 22 and 22' of other adjacent second pixels 20 and 20', respectively. Accordingly, the second pixel 20 adjacent to the first pixel 10 includes the first pixel circuit 12 and the second light emitting device 21. The second light emitting device 21 is electrically connected to the second pixel circuit 22 of another adjacent second pixel 20'. The second light emitting device 21' of the second pixel 20' is electrically connected to the second pixel circuit 22' of another adjacent second pixel 20''. The second pixel circuits 22 and 22' are respectively connected to the second light emitting devices 21 and 21' by second wires 32.

The second pixel 20'', which is the leftmost pixel in FIG. 8, may be disposed on an outermost region of a panel of the flat panel display device, and may be a dummy pixel that does not include any light emitting device. The second pixel 20'' may also be formed in a non-overlapped area in which laser beams do not overlap each other, and may be a third pixel that is different from the second pixels including their second light emitting devices.

The second pixel circuits 22 and 22' of FIG. 8 may have the same structure as that of the first pixel circuit 12 so that the first pixel 10 and the second pixels 20 and 20' can have the same light emission characteristics. Each of the pixel circuits 12, 22, and 22' of FIG. 8 may be configured as described above with reference to FIG. 4. Similar to as above, the first pixel 10 is formed in an overlap area, and the second pixels 20, 20', and 20" may be formed in a non-overlap area, i.e., the first pixel 10 is formed in the first area A1 of FIG. 2, and the second pixels 20, 20', and 20" may be formed in the second area A2 of FIG. 2.

Figure 9:
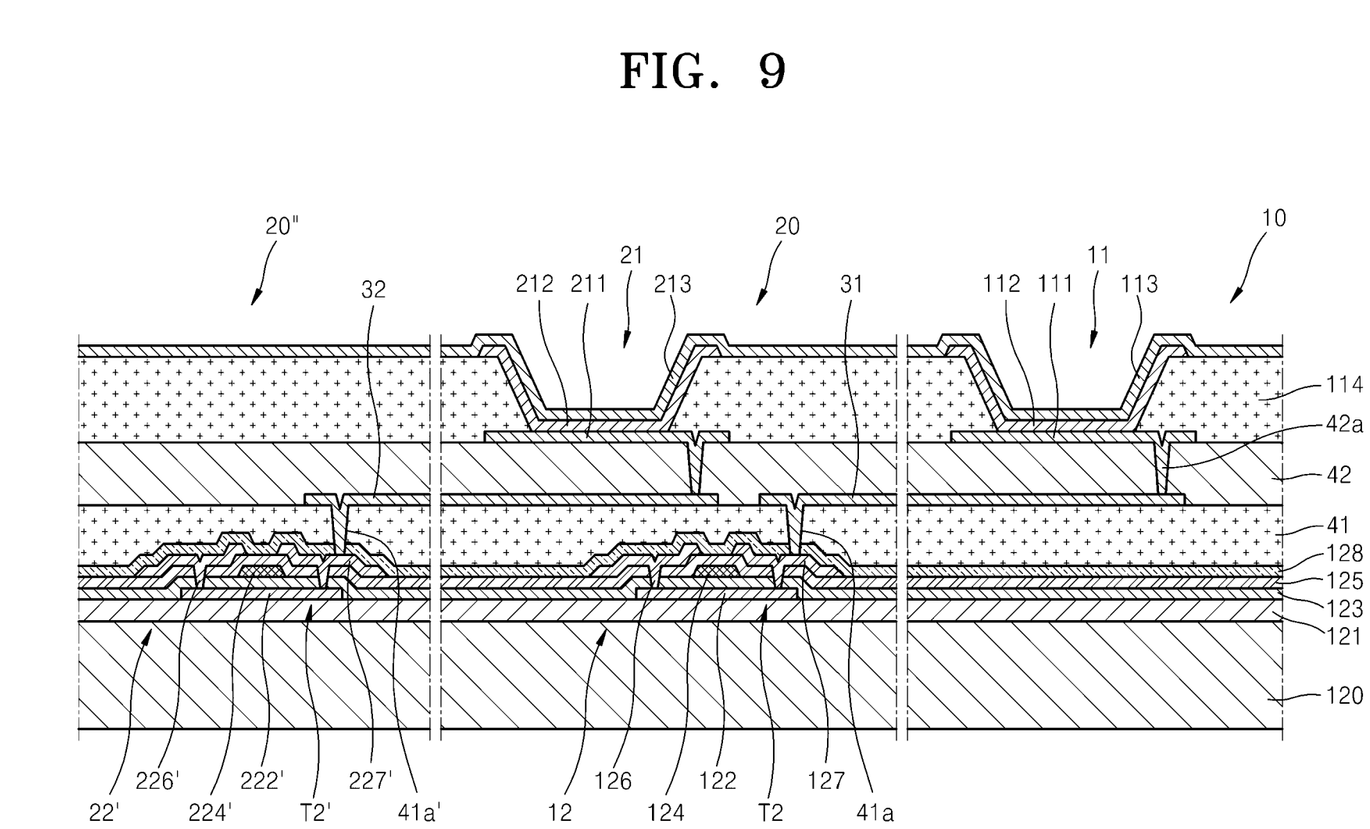
FIG. 9 is a cross-sectional view illustrating the first and second pixels of FIG. 8.

FIG. 9 is a cross-sectional view illustrating the first pixel 10 and the second pixels 20 and 20" of FIG. 8, while omitting the second pixel 20' therefrom. A thin film transistor T2' of the pixel circuit 22' is the same in configuration as that of the pixel circuit 12 described above with reference to FIG. 7. Referring to FIG. 9, the second light emitting device 21 includes a second pixel electrode 211, a second organic layer 212, and a second common electrode 213 similar to the first light emitting device 11. The second thin film transistor T2' of the second pixel circuit 22' of the second pixel 20" which is disposed on the outermost region of the panel includes an active layer 222', a gate electrode 224', a source electrode 226', and a drain electrode 227'. The second wire 32 is formed on the first insulating layer 41 similar to the first wire 31, and contacts the drain electrode 227' through a contact hole 41a'.

Since no pixel circuit is formed in the overlapped area in which laser beams overlap each other, the flat panel display device of FIG. 8 can provide uniform light emission characteristics over the entire panel.

Although the second light emitting device included in one second pixel is electrically connected to the second pixel circuit included in another adjacent second pixel, aspects of the present invention are not limited thereto. Although not shown, the second pixel 20 including the first pixel circuit 12 connected to the first light emitting device 11 of the first pixel 10 may further include the second pixel circuit 22 connected to the second light emitting device 21. Such a configuration can be applied to a large flat panel display device with a large single pixel size.

As described above, the flat panel display device according to aspects of the present invention can provide uniform light emission characteristics over the entire panel because no pixel circuits are formed in overlapped areas in which laser beams overlap each other.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A flat panel display device, comprising:
   a first pixel comprising a first light emitting device and not comprising a pixel circuit; and
   a second pixel spaced apart from the first pixel and comprising a first pixel circuit that is electrically connected to the first light emitting device and not comprising a light emitting device.

2. The flat panel display device of claim 1, wherein the first circuit comprises:
   a thin film transistor comprising a source electrode, a drain electrode, a gate electrode, and an active layer,
   wherein the active layer is formed of a polycrystalline silicon layer formed from an amorphous silicon layer by an excimer laser annealing (ELA) process and formed in an area of the flat panel display device in which lasers used in the ELA process do not overlap.

3. The flat panel display device of claim 2, wherein the first pixel is formed in an area of the flat panel display device in which the lasers used in the ELA process overlap.

4. A flat panel display device comprising:
   a first pixel comprising a first light emitting device and not comprising a pixel circuit; and
   a second pixel spaced apart from the first pixel and comprising a second light emitting device and a first pixel circuit that is electrically connected to the first light emitting device, wherein the second pixel does not comprise a second pixel circuit electrically connected to the second light emitting device; and
   a third pixel spaced apart from the first pixel and the second pixel and comprising a second pixel circuit that is electrically connected to the second light emitting device, and not comprising a light emitting device.

5. A flat panel display device comprising:
   a first area comprising a plurality of first pixels, each of which comprises a first light emitting device and does not comprise a pixel circuit;
   a second area comprising a plurality of second pixels spaced apart from the first pixels, each of which comprises a first pixel circuit that is electrically connected to the first light emitting device of one of the first pixels; and
   a plurality of first wires, which connect respectively the first light emitting devices of the first pixels to the first pixel circuits of the second pixels,
   wherein the first pixel circuits each comprise a source electrode, a drain electrode, a gate electrode, and an active layer,
   wherein the active layers of the first pixel circuits are formed of polycrystalline silicon formed by an excimer laser annealing (ELA) process and are in an area of the flat panel display device in which lasers of the ELA process do not overlap, and
   wherein the first area is in an area of the flat panel display device in which the lasers of the ELA process overlap.

6. The flat panel display device of claim 5, wherein:
   each of the plurality of second pixels of the second area further comprises a second light emitting device,
   a second pixel circuit electrically connected to the second light emitting device, and
   the flat panel display device further comprises a plurality of second wires, which connect respectively the second light emitting devices of the second area to the second pixel circuits of the second area.

7. The flat panel display device of claim 6, wherein the second light emitting device of each of the plurality of second pixels is directly driven by the second pixel circuit of an adjacent second pixel.

8. The flat panel display device of claim 5, wherein the second area is in the area of the flat panel display device in which the lasers of the ELA process do not overlap.

9. A flat panel display device comprising:
   a first area comprising a plurality of first pixels, each of which comprises a first light emitting device and does not comprise a pixel circuit;
   a second area comprising a plurality of second pixels, each of which comprises a first pixel circuit that is electrically connected to the first light emitting device of one of the first pixels;
   a plurality of first wires, which connect respectively the first light emitting devices of the first pixels to the first pixel circuits of the second pixels;
   a first insulating layer to cover the first pixel circuits; and
   a second insulating layer to cover the first insulating layer,
   wherein the first wires are disposed between the first insulating layer and the second insulating layer, and the first light emitting devices are disposed on the second insulating layer.

10. A flat panel display device comprising:
a first area comprising a plurality of first pixels, each of which comprises a first light emitting device and does not comprise a pixel circuit;
a second area comprising a plurality of second pixels, each of which comprises a first pixel circuit that is electrically connected to the first light emitting device of one of the first pixels, a second light emitting device, and a second pixel circuit electrically connected to the second light emitting device;
a plurality of first wires, which connect respectively the first light emitting devices of the first pixels to the first pixel circuits of the second pixels;
a plurality of second wires, which connect respectively the second light emitting devices of the second area to the second pixel circuits of the second area;
a first insulating layer to cover the first pixel circuits and the second pixel circuits; and
a second insulating layer to cover the first insulating layer,
wherein the first wires and the second wires are disposed between the first insulating layer and the second insulating layer, and the first light emitting devices and the second light emitting devices are disposed on the second insulating layer.

11. A flat panel display device comprising:
a first area comprising a plurality of first pixels, each of which comprises a first light emitting device and does not comprise a pixel circuit;
a second area comprising a plurality of second pixels, each of which comprises a first pixel circuit that is electrically connected to the first light emitting device of one of the first pixels;
a plurality of first wires, which connect respectively the first light emitting devices of the first pixels to the first pixel circuits of the second pixels;
a first insulating layer to cover the first pixel circuits; and
a second insulating layer to cover the first insulating layer,
wherein the second insulating layer is planarized and the first light emitting devices are disposed on the second insulating layer.

12. A flat panel display device, comprising:
a first pixel comprising a light emitting device and not comprising a pixel circuit; and
a second pixel spaced apart from the first pixel and comprising a pixel circuit that is electrically connected to the light emitting device, the pixel circuit comprising a thin film transistor having a source electrode, a drain electrode, a gate, and an active layer,
wherein the active layer is formed of a polycrystalline silicon crystallized from an amorphous silicon and patterned from an area of the polycrystalline silicon in which lasers of an excimer laser annealing (ELA) process do not overlap, and
wherein the first pixel is formed in an area of the flat panel display in which the lasers of the ELA process overlap.

* * * * *